(12) United States Patent
Chen et al.

(10) Patent No.: US 6,665,355 B1
(45) Date of Patent: Dec. 16, 2003

(54) METHOD AND APPARATUS FOR PILOT-AIDED CARRIER ACQUISITION OF VESTIGIAL SIDEBAND SIGNAL

(75) Inventors: Ting-Yin Chen, San Jose, CA (US);
Ravi Bhaskaran, Santa Clara, CA (US); Christopher Keate, Santa Clara, CA (US); Kedar D. Shirali, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/391,973

(22) Filed: Sep. 8, 1999

(51) Int. Cl.[7] .................................................. H03D 1/24
(52) U.S. Cl. ...................................... 375/321; 375/326
(58) Field of Search ................................ 375/326, 321, 375/345, 323; 348/726, 725, 21; 371/37.11

(56) References Cited

U.S. PATENT DOCUMENTS 6,356,598 B1 * 3/2002 Wang ......................... 375/321
6,512,555 B1 * 1/2003 Patel et al. .................. 348/726

OTHER PUBLICATIONS

*Guide To The Use Of The ATSC Digital Television Standard*, Advanced Television Systems Committee, Oct. 4, 1995 (pp. 105–126).

*ATSC Digital Television Standard*, Advanced Television Systems Committee, Sep. 16, 1995 (pp. 46–60).

* cited by examiner

*Primary Examiner*—Stephen Chin
*Assistant Examiner*—Curtis Odom
(74) *Attorney, Agent, or Firm*—Conley, Rose & Tayon

(57) ABSTRACT

An inexpensive synchronous detection module is disclosed for a sideband signal receiver that provides for flexibility in design of the tuner. The detection module is adaptable to detection of upper or lower sideband signals. One embodiment includes an analog-to-digital converter, a Hilbert transform filter, a sideband selection switch, a complex multiplier, a carrier recovery. loop, a matched filter, and a decimator. The analog-to-digital converter oversamples an intermediate frequency (IF) signal from the tuner, and the Hilbert transform filter generates a Hilbert transform of the digital IF signal. An analytic IF signal can be generated from the digital IF signal by multiplying the Hilbert transform of the digital IF signal by $j(=sqrt(-1))$, and adding the resulting imaginary-valued signal to the digital IF signal. The sideband selection switch can "flip" the analytic IF signal by inverting the imaginary-valued signal. The complex multiplier multiplies the analytic IF signal by a complex-value sinusoid to shift the analytic IF signal to baseband. The resulting analytic baseband signal is match filtered and decimated to form a baseband double sideband signal with one sample per symbol period. The carrier recovery loop operates on the imaginary part of the analytic baseband signal to generate the complex sinusoid that shifts the analytic IF signal to baseband.

11 Claims, 3 Drawing Sheets

METHOD AND APPARATUS FOR PILOT-AIDED CARRIER ACQUISITION OF VESTIGIAL SIDEBAND SIGNAL

BACKGROUND OF THE INVENTION

This invention relates to an apparatus for receiving and detecting a vestigial sideband signal. More specifically, this invention relates to a device for digitally detecting and removing a pilot frequency while digitally down-converting an intermediate frequency signal to baseband.

The Advanced Television Systems Committee (ATSC) has prepared a Digital Television System (DTS) standard. The DTS standard outlines various system characteristics of the Advanced Television (ATV) system proposed for use in the U.S., and Annex D in particular specifies the Radio Frequency (RF) transmission subsystem for the DTS standard. The RF transmission subsystem performs amplitude and vestigial sideband modulation (VSB) in two modes: a terrestrial mode (8-level VSB, or simply 8 VSB)) and a high data rate mode (16-level VSB, or simply 16 VSB). For explanatory purposes, the following discussion focuses on the 8 VSB standard, although the invention is applicable to any VSB signal having a pilot tone.

Turning now to the figures, FIG. 1 shows one embodiment of an ATV transmitter 100. The ATV transmitter comprises a data randomizer 102, a Reed-Solomon encoder 104, an interleaver 106, a trellis encoder 108, a sync word insertion module 110, a pilot insertion module 112, a VSB modulator 114, and a radio-frequency (RF) up-converter 116. The ATV transmitter 100 receives a digital audiovisual signal, e.g. an MPEG bitstream, in the form of 188 byte data packets. The first byte is a synchronization byte, and the remaining 187 bytes are payload data.

Data randomizer 102 drops the synchronization byte and changes each remaining byte value according to a known pseudo-random number pattern in order to eliminate repetitious patterns and thereby provide the data with a completely random noise-like character. Reed-Solomon encoder 104 encodes the 187 randomized bytes to add 20 redundancy bytes to enable future error correction of up to 10 byte errors. Interleaver 106 re-orders the encoded bytes to intermix the byes from different packets and thereby provide resistance to burst errors (since all the bytes for a given packet are no longer concentrated in a short time interval). Trellis encoder 108 provides further encoding and modulation. At the trellis encoder output, 328 symbols are produced for every 187 input bytes. Sync word insertion module 110 prepends a 4-symbol segment synchronization word to each group of 328 symbols to form a 332 symbol data segment, and further inserts a field synchronization segment for every set of 312 data segments to form a 313 segment data field. Pilot insertion module 112 provides a DC offset to all the symbols. The DC offset will appear as a carrier, or "pilot", tone in the modulated signal. VSB modulator 114 modulates the symbols from module 112 onto an intermediate frequency (IF) carrier in 8-level amplitude-modulated vestigial-sideband form, and RF up-converter 116 moves the IF signal into the assigned frequency channel, and amplifies and filters the output signal before supplying it to a transmit antenna.

FIG. 2 shows one embodiment of an ATV receiver 200 that comprises tuner 202, IF module 204, NTSC rejection filter 206, equalizer 208, phase tracker 210, trellis decoder 212, de-interleaver 214, Reed-Solomon decoder 216, and de-randomizer 218. Tuner 202 receives all the signals in a designated frequency band from the receiver antenna, and downmixes a selected channel to IF (e.g. 44 MHz). IF module 204 filters out undesired adjacent channels using a square-root raised-cosine bandpass filter, and locks on to the carrier tone using a narrowband frequency-and-phase locked loop (FPLL). The output of module 204 is a synchronously-detected baseband signal.

During the transition period from the National Television Standards Committee (NTSC) standard to the DTS standard, many ATV transmissions will take place in channels which are shared by NTSC transmissions in neighboring broadcast regions. It is necessary that the receiver possess some immunity to these NTSC transmissions. Accordingly, NTSC rejection filter 206 is a "comb" filter with nulls near the standard NTSC luminance, color, and audio carrier frequencies to screen out interference from NTSC transmissions. Equalizer 208 is a moving-window adaptive equalizer that operates to remove any linear distortions (e.g. spectrum tilt, multi-path echo) from the received signal and thereby maximize the "eye openings" in the equalized signal. Phase tracker 210 is a wide-band first-order tracking loop that removes any remaining phase noise not tracked by the FPLL carrier recovery loop. The phase tracker 210 operates independently of the preceding modules.

Trellis decoder 212 operates according to the Viterbi algorithm to demodulate the data. De-interleaver 214 reverses the operation of interleaver 106 to gather the dispersed bytes from Reed-Solomon encoded packets back together, and Reed-Solomon decoder 216 decodes the packets, providing error correction as needed. The de-randomizer then reverses the operation of randomizer 102 to reproduce the original data packets. Further details are available in Annex D of the ATSC DTS Standard, and the Guide to the Use of the ATSC Digital Television Standard, of which pages 105–126 are hereby incorporated by reference.

Receivers for ATV transmissions will be mass-manufactured and sold to the public as part of televisions and other electronics. It would benefit consumers if receivers could provide high performance with minimal costs. Systems built from modular components generally benefit from reduced costs due to re-usability of existing components in new designs, but the cost savings are even more realizable when the costs of the individual high-performance modules are reduced.

SUMMARY OF THE INVENTION

Accordingly, there is disclosed herein an inexpensive synchronous detection module for a sideband signal receiver. In one embodiment, the disclosed synchronous detection module provides for flexibility in design of the tuner since the detection module is adaptable to detection of upper or lower sideband signals. The embodiment includes an analog-to-digital converter, a Hilbert transform filter, a sideband selection switch, a complex multiplier, a carrier recovery loop, a matched filter, and a decimator. The analog-to-digital converter oversamples an intermediate frequency (IF) signal from the tuner, and the Hilbert transform filter generates a Hilbert transform of the digital IF signal. An analytic IF signal can be generated from the digital IF signal by multiplying the Hilbert transform of the digital IF signal by $j(=sqrt(-1))$, and adding the resulting imaginary-valued signal to the digital IF signal. The sideband selection switch can "flip" the analytic IF signal by inverting the imaginary-valued signal. The complex multiplier multiplies the analytic IF signal by a complex-value sinusoid to shift the analytic IF signal to baseband. The resulting analytic baseband signal is match filtered and decimated to form a baseband double sideband signal with one sample per symbol period. The carrier recovery loop operates on the imaginary part of the analytic baseband signal to generate the complex-value sinusoid that shifts the analytic IF signal to baseband.

The present invention further contemplates a method for demodulating a sideband signal. The method comprises: (i) oversampling an intermediate frequency (IF) signal to obtain a digital IF signal; (ii) filtering the digital IF signal to obtain an analytic IF signal; (iii) multiplying the analytic IF signal by a complex frequency signal to obtain an analytic baseband signal; and (iv) generating the complex frequency signal from an imaginary part of the analytic baseband signal to minimize energy of this imaginary part. The method may further include inverting an imaginary part of the analytic IF signal before multiplying the analytic signal by the complex frequency signal.

The disclosed embodiments of the present invention advantageously implement the carrier recovery loop as a phase-lock loop (PLL) with a digital frequency sweep rather than the more complex frequency and phase lock loop (FPLL). This avoids the presence of nonlinearities in the feedback loop, thereby ensuring robust loop behavior. The disclosed embodiments are advantageously able to receive both upper and lower sideband signals without any redesign, and the disclosed digital sweep method is advantageously easy to implement.

BRIEF DESCRIPTION OF THE DRAWINGS

Other objects and advantages of the invention will become apparent upon reading the following detailed description and upon reference to the accompanying drawings in which.

Figure 1:
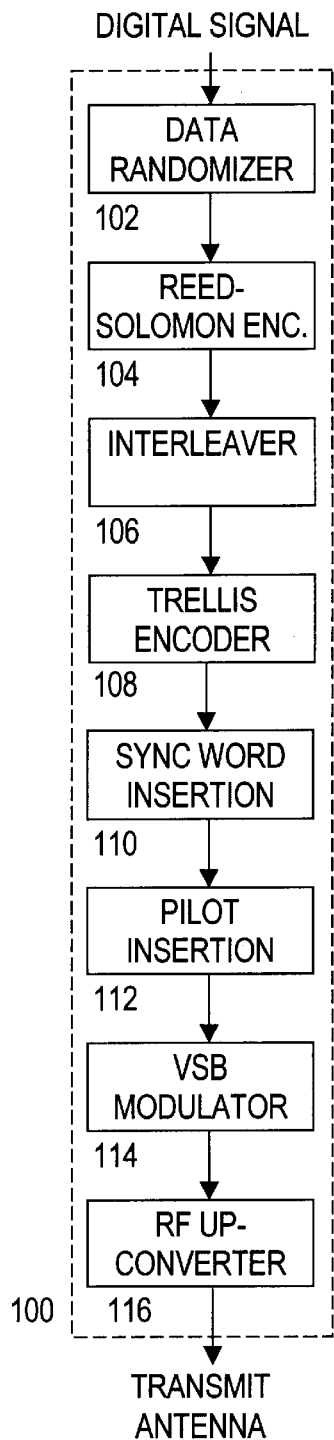
FIG. 1 is a block diagram of an ATV transmitter embodiment.
Figure 2:
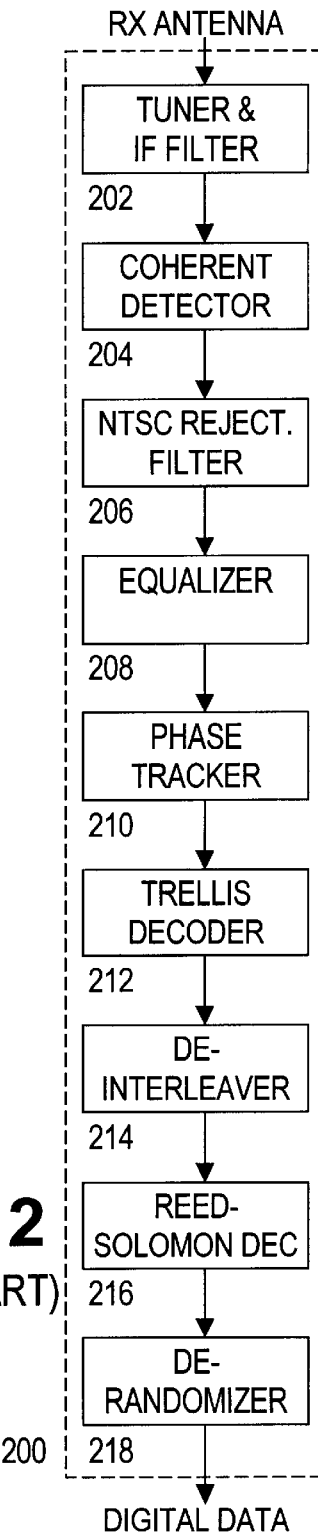
FIG. 2 is a block diagram of an ATV receiver embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Synchronous detection module 204 is specified by the ATSC standard to include a frequency-and-phase lock loop (FPLL). Unfortunately, a loop of this type requires an undesirable hardware or software complexity for the filtering operations, and a synchronous detection module employing this loop is inflexible in terms of being able to detect upper and lower sideband signals at high and low intermediate frequencies. A more flexible module architecture would allow greater freedom in tuner design.

Figure 5:
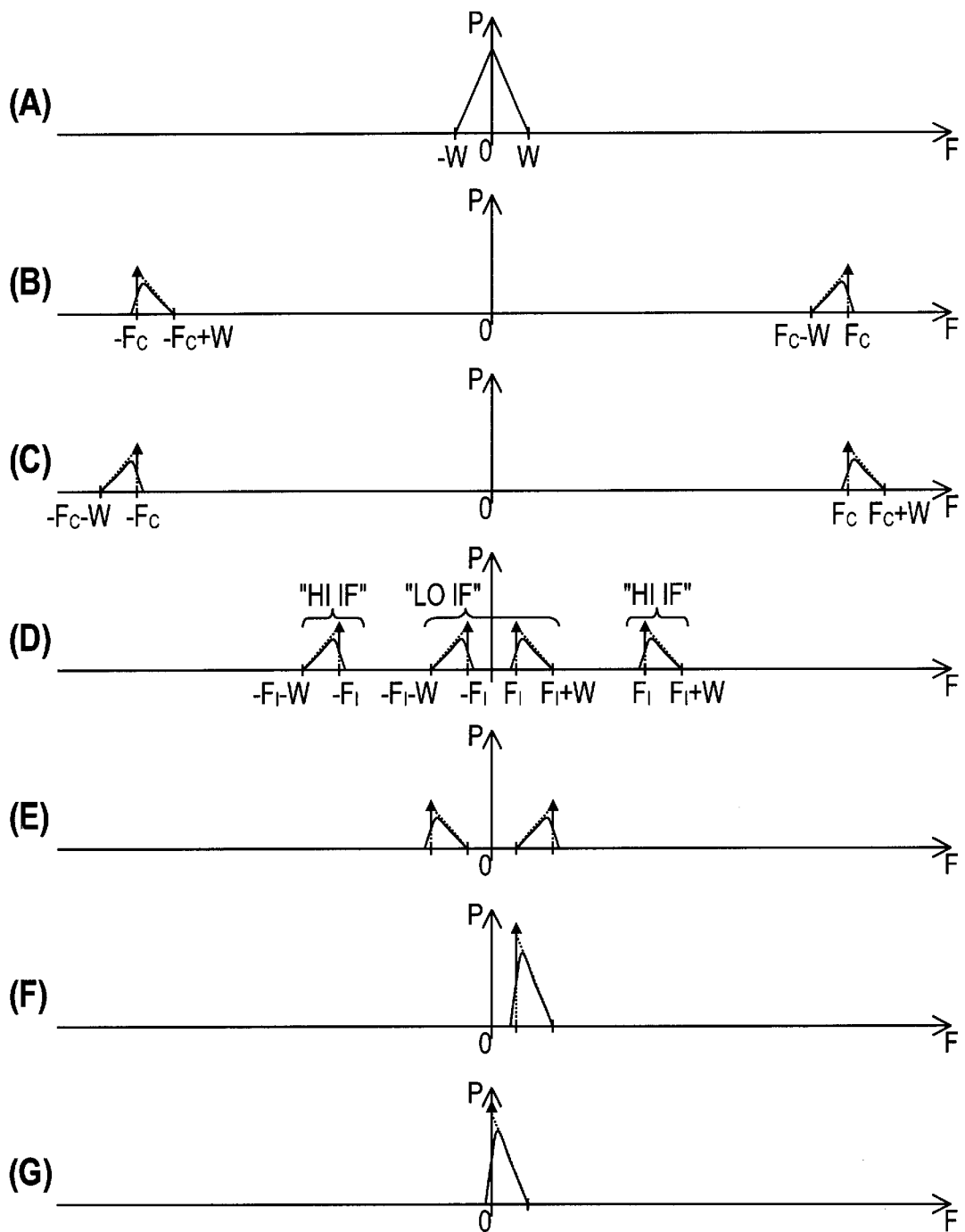
FIGS. 5(a)–5(g) are graphs of signal spectra to aid in explaining operation of the IF detection module embodiment.

Referring now to FIG. 5, FIG. 5(a) shows an arbitrary power spectral density for a message signal to be transmitted (e.g. a signal at the output of block 110 in FIG. 1). A pilot tone is inserted, and the signal is sideband modulated and upconverted to a transmission frequency, producing the transmitted signal spectrum shown in FIG. 5(b) (lower sideband modulation) or FIG. 5(c) (upper sideband modulation). Sideband modulation herein refers to both single sideband (SSB) modulation and vestigial sideband (VSB) modulation. The spectrum for SSB modulation is shown in broken outline, while the spectrum for VSB modulation is shown as a solid line. "W" is the bandwidth of the signal, $F_C$ is the carrier frequency, and $F_I$ is the intermediate frequency.

Various tuner designs may be used, and the intermediate frequency spectrum of a downconverted signal may vary based on the tuner design. Two cases are shown in FIG. 5(d) for the downconversion of the upper sideband transmission signal of FIG. 5(c). In the low intermediate frequency case ("LO IF"), at least some portion of the signal spectrum is within W of zero frequency, whereas in the high intermediate frequency case ("HI IF"), the signal energy is all outside the frequency range –W to W. This distinction is made because a high IF signal can be directly downconverted by mixing it with a sinusoidal signal at the carrier frequency and low-pass filtering the result, but a low IF signal requires additional steps to avoid spectral distortion.

It is noted that a high IF signal can be converted to a low IF signal through aliasing. That is, sampling a high IF signal at a sampling rate that is less than the carrier frequency but greater than 2W will result in a signal having a "folded" frequency spectrum in which the signal energy appears at lower frequencies. This spectrum may appear like the low IF case in FIG. 5(d) or it may be "flipped" as shown in FIG. 5(e). It is also noted that these spectra can also result from downconversion of the lower sideband signal of FIG. 5(b), whether provided directly by the tuner, or aliased downward by sampling. Accordingly, a detection module that can operate on flipped and unflipped low IF signals is easily adapted to operating on upper and lower sideband signals at both high IF and low IF.

Figure 3:
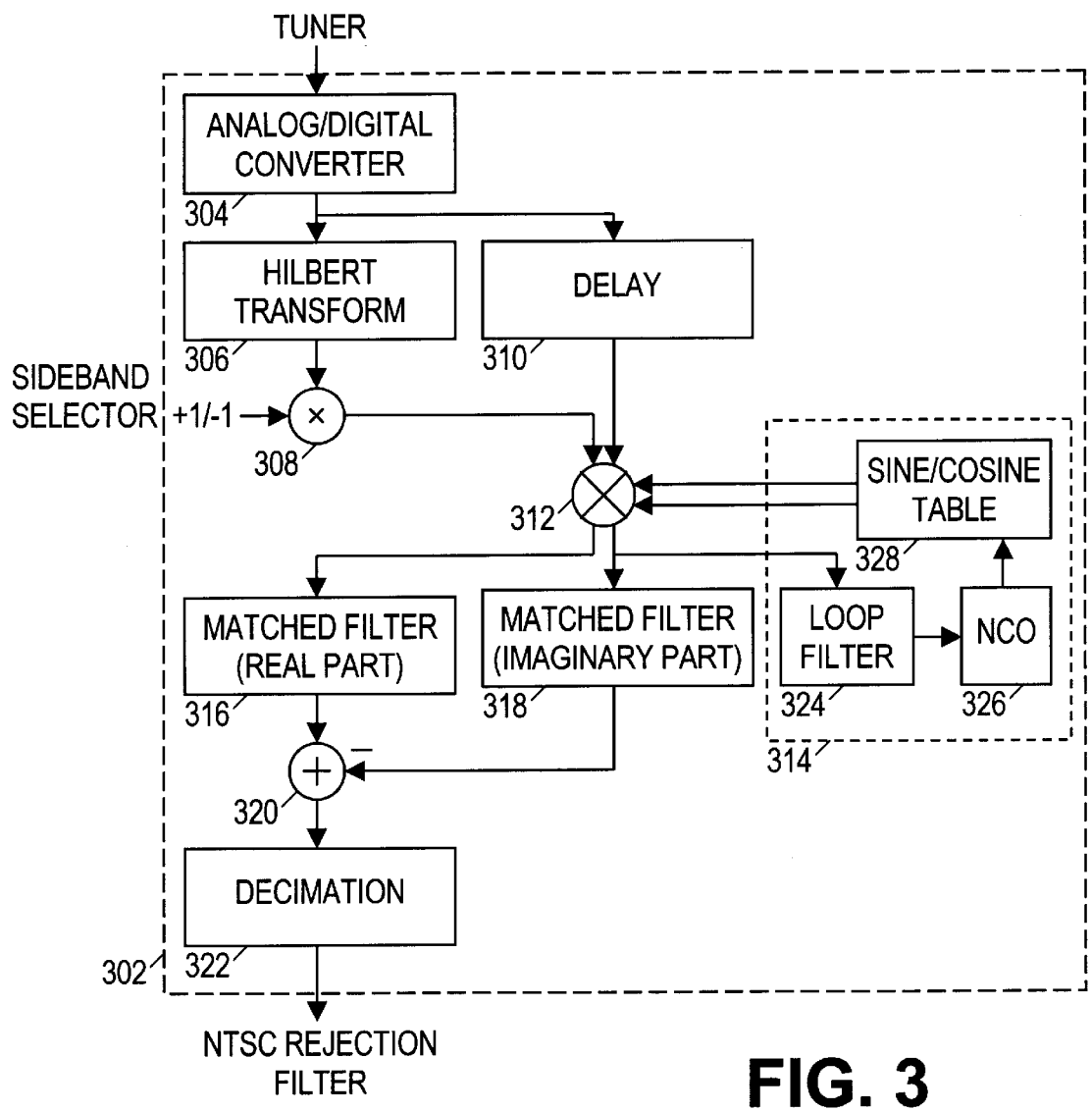
FIG. 3 is a block diagram of a synchronous IF detection module embodiment.

An embodiment of one such detection module is shown in FIG. 3. Synchronous detection module 302 preferably includes an analog-to-digital (A/D) converter 304, a Hilbert transform filter 306, a sideband selector 308, a delay line 310, a complex multiplier 312, a carrier recovery loop 314, a matched filter 316, 318, an adder 320, and a decimation filter 322. The A/D converter 304 samples a band-limited IF signal provided by the tuner. If the tuner output is a high IF signal, the sampling rate of the A/D converter is chosen so as to alias the high IF signal into a low IF signal. The sampling rate is preferably about three or more times the modulated symbol rate.

A high IF tuner output signal could have an IF carrier in the range from 35 MHz to 45 MHz, for example, while a low IF tuner output signal could have an IF carrier in the range from 3 to 13 MHz. Assuming a sampling frequency of 3×10.69 MHz, a high IF signal in the range between 35 MHz and 45 MHz would be appear as a flipped signal in the range 29 MHz to 19 MHz. Other sampling frequencies may also be selected.

A Hilbert transform filter is a filter that constructs the imaginary component of an analytic signal from the real component. Unlike real signals, analytic signals need not be symmetric about the zero-frequency axis. It can be shown that the analytic signal $$a(t)=s(t)+j\hat{s}(t),$$

where s(t) is the real signal and ŝ(t) is the Hilbert transform of the real signal, has no negative frequency components, as shown in FIG. 5(f). If the Hilbert transform is multiplied by −1, the analytic signal has no positive frequency components. In either case, conversion to a baseband signal can then be accomplished by a simple frequency shift.

Hilbert transform filter 306 accordingly produces a discrete Hilbert transform of the sampled signal and sideband selector switch 308 is set to flip the sign of the Hilbert transform if the sampled signal is a lower sideband signal. Delay line 310 delays the sampled signal for the time the Hilbert transform filter 306 takes to produce the Hilbert transform. The sampled signal is the real part of an analytic signal, and the Hilbert transform signal is the imaginary part of the analytic signal. The real and imaginary parts of the analytic signal are provided to complex multiplier 312 which multiplies the analytic signal with a complex-valued sinusoid signal produced by carrier recovery loop 314. The output of complex multiplier 312 is a frequency-shifted version of the analytic signal, and the amount and direction of the frequency shift is determined by the frequency of the complex sinusoid.

Carrier recovery loop 314 sets the phase and frequency of the complex sinusoid to minimize the energy of the imaginary part of the analytic signal. This minimization occurs when the complex sinusoid has a phase equal and opposite to the phase of the pilot tone in the analytic signal. This causes the pilot tone frequency to be shifted to zero, e.g. as shown in FIG. 5(g), so that the frequency-shifted analytic signal is an analytic baseband signal. The imaginary part of the analytic signal, when used as an estimate of the phase error, causes the carrier recovery loop to shift the frequency of the complex sinusoid in the correct direction, eventually reducing the frequency to zero when downconversion is complete.

It is noted that the carrier recovery loop 314 is linear in that the input to NCO 324 is determined by purely linear operations (e.g. summation and integration) on the error signal. This is dramatically different from prior art methods which generally require nonlinear operations to determine both a correct phase and a correct frequency for carrier recovery.

A matched filter 316, 318 operates on the analytic baseband signal to maximize the detection signal-to-noise ratio. The matched filters are designed using a square-root raised cosine symbol shape and designing the filter bandwidth to be half the symbol rate plus a bandwidth expansion factor of 11.5%, with a center frequency at one fourth the symbol rate. A Hanning window may be used in the filter design to improve rejection of adjacent channel interference.

The matched filter coefficients are complex-valued, however the imaginary part of the matched filter output is discarded (resulting in a double sideband signal somewhat like the original message spectrum shown in FIG. 5(a)). Consequently, the matched filter can be implemented in two portions 316, 318. The real parts of the matched filter coefficients form a filter 316 for the real part of the analytic baseband signal, while the imaginary parts of the matched filter coefficients form a filter 318 for the imaginary part of the baseband signal. It is noted that real filter 316 is preferably modified to block the DC component of the analytic baseband signal, so as to remove the pilot tone from the signal. The two filter outputs are combined by adder 320 and decimated to one sample per symbol by decimator 322. It is noted that to reduce the number of filtering operations, the decimation may be performed in the matched filters rather at the adder output. In other words, the matched filters may operate to receive three samples per symbol and produce only one sample per symbol, if desired.

In a preferred embodiment, carrier recovery loop 314 includes a loop filter 324, a numerically controlled oscillator (NCO) 326, and a sine/cosine lookup table 328. Loop filter 324 preferably provides a (possibly negative) phase increment value to NCO 326. NCO 326 may be a phase counter that increments by the phase increment value, rolling over at values corresponding to 0 and 2π radians. The NCO 326 provides a current phase value φ to the sine/cosine table 328, which then provides the real and imaginary parts of the value cos φ+j sin φ to the complex multiplier 312.

Figure 4:
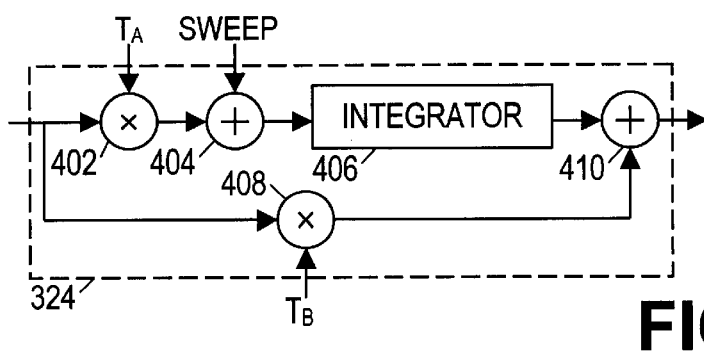
FIG. 4 is a block diagram of a loop filter embodiment.

FIG. 4 shows one embodiment of loop filter 324 having a first scaling element 402, a first adder 404, an integrator 406, a second scaling element 408, and a second adder 410. Scaling element 402 multiplies the imaginary part of the analytic baseband signal by a scale factor $T_A$, while scaling element 408 multiplies it by a scale factor $T_B$. These scale factors are selected to set the loop bandwidth using the formulas:

$$T_A=(\omega_n T_S)^2/K$$

$$T_B=2\omega_n T_S/K$$

where $\omega_n$ is the desired loop bandwidth, $T_S$ is the sampling interval, and K is the phase detector gain. Preferably, these scale factors are rounded to the nearest power of two so that the multiplications can be implemented as simple bit shifts. In general, though, smaller loop bandwidths provide faster frequency acquisition. A preferred loop bandwidth is approximately 3–6 KHz.

Integrator 406 integrates the biased or unbiased phase errors (explained below) to produce an estimated phase increment value. This value is adjusted by the addition of the scaled phase error value from scaling element 408. This produces the phase increment value that is provided to the NCO 326.

As this filter architecture has a narrow pull-in range, a provision is made for "sweeping" or "scanning" across the frequency range until phase lock is detected. Before phase lock is achieved, the integrator 406 is provided with an initial value and a non-zero sweep increment is provided to adder 404. This biases the phase error in a desired direction, resulting in a sweep of integrated phase error values by integrator 406. The sweep rate is preferably kept below a few hundred kilohertz per second. Once phase lock is detected, the sweep increment is set to zero, removing the error bias and allowing the carrier recovery loop to achieve an accurate phase lock.

Phase lock can be detected in several ways, including the AFC Filter Approach and the Power Variance Approach. The AFC Filter Approach is based on using a sharp single pole IIR filter that has a bandwidth of a few hundred hertz about D.C. When the pilot tone is acquired and the signal is downconverted to baseband, the output power from the IIR filter increases. The difference in power output for baseband and non-baseband signals is large enough to allow the use of a simple threshold detector to provide a 'lock' or 'no-lock' indication with a high level of confidence. The difference in powers depends considerably on the sharpness of the IIR filter, but very sharp filters may be unstable due to the proximity of the pole to the unit circle.

The Power Variance Approach is based on measuring the variance of the power of the real or imaginary part of the complex multiplier output. Since a frequency error causes the amplitude modulation signal constellation to rotate, a large variance in power is observed relative to the power variance when no frequency error exists. The variance level can therefore be used to provide the 'lock' or 'no-lock' indication.

In a preferred embodiment, the A/D converter 304 provides 10 bit samples. It is recognized that no ideal Hilbert transform filter exists, but it is desired to provide a filter that attenuates the negative frequency components of the analytic signal by at least 35 dB. This may be achieved with as few as 25 taps. The matched filters preferably include no more than 125 taps. The filters are preferably implemented using fixed point numbers, with 12 bits and 15 bits respectively for the coefficients of the Hilbert and matched filters. Hilbert filter output is preferably represented by 10 bits, as are the real and imaginary parts of the complex sinusoid. The complex multiplier output is preferably 11 bits, the matched filter outputs are preferably 25 bits, and the output of adder 320 is preferably 9 bits. The output of scaling element 402 is preferably 30 bits, the output of adder 404 and integrator 406, 31 bits, and the output of adder 410 32 bits. The output of scaling element 408 is preferably 17 bits. The input to the lookup table is preferably 12 bits. In the presence of worst-case adjacent channel interference, this fixed point implementation suffers a performance loss of only about 0.5–0.7 dB relative to the theoretical ideal. It is expected that some of this SNR loss can be recovered by the downstream equalizer.

Numerous variations and modifications will become apparent to those skilled in the art once the above disclosure is fully appreciated. For example, alternative carrier recovery loop architectures may be used. It is intended that the following claims be interpreted to embrace all such variations and modifications.

What is claimed is:

1. A receiver which comprises:
   a tuner configured to receive a sideband transmission signal and configured to convert the sideband transmission signal to an intermediate frequency (IF) signal;
   a digital detection module which includes:
      an analog-to-digital converter coupled to receive the IF signal and configured to sample the signal to produce a digital IF signal;
      a Hilbert transform filter coupled to receive the digital IF signal and configured to produce a Hilbert transform signal;
      a complex multiplier coupled to receive the digital IF signal as a real part of an analytic sideband signal and the Hilbert transform signal as an imaginary part of the analytic sideband signal, wherein the complex multiplier is configured to multiply the analytic sideband signal with a complex operand signal to produce an analytic baseband signal;
      a linear carrier recovery loop coupled to receive an imaginary part of the analytic baseband signal and configured to provide the complex operand signal to the complex multiplier to minimize the energy of the imaginary part of the product signal; and
      a sideband selection switch coupled between the Hilbert transform filter and the complex multiplier, wherein the sideband selection switch is configured to invert the Hilbert transform signal when a sideband selection input is asserted.

2. A receiver which comprises:
   a tuner configured to receive a sideband transmission signal and configured to convert the sideband transmission signal to an intermediate frequency (IF) signal;
   a digital detection module which includes:
      an analog-to-digital converter coupled to receive the IF signal and configured to sample the signal to produce a digital IF signal;
      a Hilbert transform filter coupled to receive the digital IF signal and configured to produce a Hilbert transform signal;
      a complex multiplier coupled to receive the digital IF signal as a real part of an analytic sideband signal and the Hilbert transform signal as an imaginary part of the analytic sideband signal, wherein the complex multiplier is configured to multiply the analytic sideband signal with a complex operand signal to produce an analytic baseband signal;
      a linear carrier recovery loop coupled to receive an imaginary part of the analytic baseband signal and configured to provide the complex operand signal to the complex multiplier to minimize the energy of the imaginary part of the product signal;
      a matched filter coupled to receive the product signal and configured to produce a real part of a match-filtered baseband signal; and
      a decimator configured to receive the match-filtered baseband signal and configured to produce a decimated signal having one sample per symbol.

3. A receiver which comprises:
   a tuner configured to receive a sideband transmission signal and configured to convert the sideband transmission signal to an intermediate frequency (IF) signal;
   a digital detection module which includes:
      an analog-to-digital converter coupled to receive the IF signal and configured to sample the signal to produce a digital IF signal;
      a Hilbert transform filter coupled to receive the digital IF signal and configured to produce a Hilbert transform signal;
      a complex multiplier coupled to receive the digital IF signal as a real part of an analytic sideband signal and the Hilbert transform signal as an imaginary part of the analytic sideband signal, wherein the complex multiplier is configured to multiply the analytic sideband signal with a complex operand signal to produce an analytic baseband signal; and
      a linear carrier recovery loop coupled to receive an imaginary part of the analytic baseband signal and configured to provide the complex operand signal to the complex multiplier to minimize the energy of the imaginary part of the product signal, wherein the carrier recovery loop includes:
         a loop filter configured to receive the imaginary part of the analytic baseband signal, and configured to produce a phase increment signal, wherein the loop filter comprises:
            a first adder configured to add a sweep increment to the imaginary part of the analytic baseband signal scaled by a first coefficient to produce an integrator input signal;
            an integrator configured to integrate the integrator input signal to produce an integrated phase error signal; and
            a second adder configured to add the integrated phase error signal to the imaginary part of the analytic baseband signal scaled by a second coefficient to produce the phase increment signal;
         a numerically controlled oscillator (NCO) configured to receive the phase increment signal and configured to produce a current phase signal; and a lookup table configured to receive the current phase signal and configured to provide the complex operand signal to the complex multiplier.

4. A method of demodulating a sideband signal, wherein the method comprises:

oversampling an intermediate frequency (IF) signal to obtain a digital IF signal;

filtering the digital IF signal to obtain an analytic IF signal;

inverting an imaginary part of the analytic IF signal;

multiplying the analytic IF signal by a complex frequency signal to obtain an analytic baseband signal; and generating the complex frequency signal from a complex part of the analytic baseband signal to minimize energy of said complex part of the analytic baseband signal.

5. A method of demodulating a sideband signal, wherein the method comprises:

oversampling an intermediate frequency (IF) signal to obtain a digital IF signal;

filtering the digital IF signal to obtain an analytic IF signal;

multiplying the analytic IF signal by a complex frequency signal to obtain an analytic baseband signal;

generating the complex frequency signal from a complex part of the analytic baseband signal to minimize energy of said complex part of the analytic baseband signal;

match-filtering the analytic baseband signal to obtain a match-filtered baseband signal; and decimating the match-filtered baseband signal to obtain a decimated signal having one sample per symbol.

6. A method of demodulating a sideband signal, wherein the method comprises:

oversampling an intermediate frequency (IF) signal to obtain a digital IF signal;

filtering the digital IF signal to obtain an analytic IF signal;

multiplying the analytic IF signal by a complex frequency signal to obtain an analytic baseband signal; and generating the complex frequency signal from a complex part of the analytic baseband signal to minimize energy of said complex part of the analytic baseband signal, wherein the generating includes:

loop filtering the imaginary part of the analytic baseband signal to obtain a phase increment signal, wherein the loop filtering includes:

scaling the imaginary part of the analytic baseband signal by a first scale factor to obtain a first scaled signal;

scaling the imaginary part of the analytic baseband signal by a second scale factor to obtain a second scaled signal;

adding a sweep increment to the first scaled signal to obtain a summed signal;

integrating the summed signal to obtain an integrated phase error signal; and adding the second scaled signal to the integrated phase error signal to obtain the phase increment signal;

integrating the phase increment signal with a wrap-around counter to obtain a current phase signal; and determining a sine and cosine of the current phase signal to produce the complex frequency signal.

7. The method of claim 6, wherein the first and second scale factors are powers of two.

8. A digital detection module for selectably converting an upper or lower sideband signal into a baseband signal, wherein the module comprises:

an analog-to-digital converter coupled to receive the sideband signal and configured to sample the sideband signal to produce a digital IF signal;

a Hilbert transform filter coupled to receive the digital IF signal and configured to produce a Hilbert transform signal;

a sideband selector coupled to receive the Hilbert transform signal and configured to produce an imaginary signal, wherein the imaginary signal equals the Hilbert transform signal when a sideband selector input is asserted, and wherein the imaginary signal equals an additive inverse of the Hilbert transform signal when the sideband selector input is de-asserted;

a complex multiplier coupled to receive the digital IF signal as a real part of an analytic sideband signal and the imaginary signal as an imaginary part of the analytic sideband signal, wherein the complex multiplier is configured to multiply the analytic sideband signal with a complex operand signal to produce an analytic baseband signal; and a linear carrier recovery loop coupled to receive an imaginary part of the analytic baseband signal and configured to provide the complex operand signal to the complex multiplier to minimize the energy of the imaginary part of the product signal.

9. The module of claim 8, further comprising:

a matched filter coupled to receive the product signal and configured to produce a real part of a match-filtered baseband signal; and a decimator configured to receive the match-filtered baseband signal and configured to produce a decimated signal having one sample per symbol.

10. The module of claim 8, wherein the carrier recovery loop includes:

a loop filter configured to receive the imaginary part of the analytic baseband signal, and configured to produce a phase increment signal;

a numerically controlled oscillator (NCO) configured to receive the phase increment signal and configured to produce a current phase signal;

a lookup table configured to receive the current phase signal and configured to provide the complex operand signal to the complex multiplier.

11. The module of claim 10, wherein the loop filter comprises:

a first adder configured to add a sweep increment to the imaginary part of the analytic baseband signal scaled by a first coefficient to produce an integrator input signal;

an integrator configured to integrate the integrator input signal to produce an integrated phase error signal; and a second adder configured to add the integrated phase error signal to the imaginary part of the analytic baseband signal scaled by a second coefficient to produce the phase increment signal.

* * * * *